(12) United States Patent
Chiu

(10) Patent No.: US 12,295,165 B2
(45) Date of Patent: May 6, 2025

(54) SEMICONDUCTOR DEVICE STRUCTURE

(71) Applicant: INNOSCIENCE (ZHUHAI) TECHNOLOGY CO., LTD., Zhuhai (CN)

(72) Inventor: Han-Chin Chiu, Zhuhai (CN)

(73) Assignee: INNOSCIENCE (ZHUHAI) TECHNOLOGY CO., LTD., Zhuhai (CN)

( * ) Notice: Subject to any disclaimer, the term of this patent is extended or adjusted under 35 U.S.C. 154(b) by 0 days.

(21) Appl. No.: 18/661,741

(22) Filed: May 13, 2024

(65) Prior Publication Data

US 2024/0297227 A1 Sep. 5, 2024

Related U.S. Application Data

(62) Division of application No. 17/042,183, filed as application No. PCT/CN2020/102312 on Jul. 16, 2020, now Pat. No. 12,021,121.

(51) Int. Cl.
*H10D 64/00* (2025.01)
*H10D 30/01* (2025.01)
(Continued)

(52) U.S. Cl.
CPC ......... *H10D 64/111* (2025.01); *H10D 30/015* (2025.01); *H10D 30/475* (2025.01); *H10D 30/4755* (2025.01); *H10D 62/8503* (2025.01)

(58) Field of Classification Search
CPC ............... H01L 29/402; H01L 29/2003; H01L 29/66462; H01L 29/7786; H01L 29/7787;
(Continued)

(56) References Cited

U.S. PATENT DOCUMENTS 9,590,053 B2 3/2017 Chou et al.
10,229,978 B2 3/2019 Liao
(Continued)

FOREIGN PATENT DOCUMENTS

CN 104009074 8/2014
CN 104409482 3/2015
(Continued)

OTHER PUBLICATIONS

ISA State Intellectual Property Office of the People's Republic of China, International Search Report Issued in Application No. PCT/CN2020/102312, Mar. 26, 2021, WIPO, 3 pages.
(Continued)

*Primary Examiner* — Peter M Albrecht
(74) *Attorney, Agent, or Firm* — JCIPRNET

(57) ABSTRACT

Semiconductor device structures and methods for manufacturing the same are provided. The semiconductor device structure includes a substrate, a first nitride semiconductor layer, a second nitride semiconductor layer, a gate structure and a conductive layer. The substrate has a first surface. The first nitride semiconductor layer is disposed on the first surface of the substrate. The second nitride semiconductor layer is disposed on the first nitride semiconductor layer. The gate structure is disposed on the second nitride semiconductor layer. The conductive layer is disposed on the second nitride semiconductor layer. The conductive layer has a first length extending in a first direction substantially parallel to the first surface of the substrate, a second length extending in a second direction substantially perpendicular to the first direction—from a cross section view perspective—wherein the second length is greater than the first length.

7 Claims, 15 Drawing Sheets

(51) Int. Cl.
*H10D 30/47* (2025.01)
*H10D 62/85* (2025.01)

(58) Field of Classification Search
CPC ............ H10D 64/111; H10D 62/8503; H10D 30/015; H10D 30/475; H10D 30/4755
See application file for complete search history.

(56) References Cited

U.S. PATENT DOCUMENTS

| | | |
|---|---|---|
| 10,854,720 B2 | 12/2020 | Liao |
| 2011/0169103 A1 | 7/2011 | Darwish et al. |
| 2013/0146885 A1 | 6/2013 | Brown et al. |
| 2014/0339670 A1 | 11/2014 | Henson et al. |
| 2015/0357422 A1 | 12/2015 | Liao |
| 2016/0149007 A1 | 5/2016 | Chou et al. |
| 2019/0097001 A1 | 3/2019 | LaRoche et al. |
| 2019/0172915 A1 | 6/2019 | Liao |
| 2019/0288081 A1* | 9/2019 | Shindome ............ H01L 29/402 |
| 2020/0203502 A1 | 6/2020 | Wong et al. |
| 2023/0187529 A1* | 6/2023 | Kawashima ...... H01L 29/66462 257/183 |

FOREIGN PATENT DOCUMENTS

| | | |
|---|---|---|
| CN | 105280695 | 1/2016 |
| CN | 106486543 | 3/2017 |
| CN | 109659366 | 4/2019 |
| CN | 111129123 | 5/2020 |

OTHER PUBLICATIONS

ISA State Intellectual Property Office of the People's Republic of China, Written Opinion of the International Searching Authority Issued in Application No. PCT/CN2020/102312, Mar. 26, 2021, WIPO, 4 pages.

State Intellectual Property Office of the People's Republic of China, Office Action and Search Report Issued in Application No. 2020800027737, May 20, 2023, with English translation thereof, 17 pages.

State Intellectual Property Office of the People's Republic of China, Office Action and Search Report Issued in Application No. 2020800027737, Nov. 4, 2023, with English translation thereof, 17 pages.

State Intellectual Property Office of the People's Republic of China, Decision of Rejection Issued in Application No. 2020800027737, Jan. 26, 2024, with English translation thereof, 15 pages.

* cited by examiner

SEMICONDUCTOR DEVICE STRUCTURE

CROSS-REFERENCE TO RELATED APPLICATIONS

This application is a divisional application of U.S. patent application Ser. No. 17/042,183, filed on Sep. 28, 2020, which is a national stage of International Application No. PCT/CN2020/102312, filed on Jul. 16, 2020. All of the aforementioned patent applications are hereby incorporated by reference in their entireties.

BACKGROUND

1. Field of the Disclosure

The present disclosure relates to a semiconductor device structure and more particularly to a semiconductor device structure with a conductive layer.

2. Description of Related Art

Components including direct bandgap semiconductors, for example, semiconductor components including group III-V materials or group III-V compounds (Category: III-V compounds) can operate or work under a variety of conditions or in a variety of environments (e.g., at different voltages and frequencies).

The semiconductor components may include a heterojunction bipolar transistor (HBT), a heterojunction field effect transistor (HFET), a high-electron-mobility transistor (HEMT), a modulation-doped FET (MODFET) and the like.

SUMMARY

According to some embodiments of the present disclosure, a semiconductor device structure includes a substrate, a first nitride semiconductor layer, a second nitride semiconductor layer, a gate structure and a conductive layer. The substrate has a first surface. The first nitride semiconductor layer is disposed on the first surface of the substrate. The second nitride semiconductor layer is disposed on the first nitride semiconductor layer. The gate structure is disposed on the second nitride semiconductor layer. The conductive layer is disposed on the second nitride semiconductor layer. The conductive layer has a first length extending in a first direction substantially parallel to the first surface of the substrate, a second length extending in a second direction substantially perpendicular to the first direction, from a cross section view perspective, wherein the second length is greater than the first length.

According to some embodiments of the present disclosure, a semiconductor device structure includes a substrate, a first nitride semiconductor layer, a second nitride semiconductor layer, a gate structure, a dielectric layer and a conductive layer. The substrate has a first surface. The first nitride semiconductor layer is disposed on the substrate. The second nitride semiconductor layer is disposed on the first nitride semiconductor layer. The gate structure is disposed on the second nitride semiconductor layer. The dielectric layer covers the gate structure and the second nitride semiconductor layer. The conductive layer is disposed on the dielectric layer. The conductive layer has a first length extending in a first direction substantially parallel to the first surface of the substrate at a lower surface of the conductive layer and a second length extending in the first direction different from the first length.

According to some embodiments of the present disclosure, a method of manufacturing a semiconductor device structure includes: providing a substrate having a first surface; forming a first nitride semiconductor layer on the substrate; forming a second nitride semiconductor layer on the first nitride semiconductor layer; forming a gate structure on the second nitride semiconductor layer; forming a dielectric layer on the gate structure and the second nitride semiconductor layer; forming a conductive material layer on the dielectric layer; and removing a portion of the conductive material layer without using a reticle such that a conductive layer is formed. The conductive layer has a first length extending in a first direction substantially parallel to the first surface of the substrate and a second length extending in a second direction substantially perpendicular to the first direction, from a cross section view perspective, wherein the second length is greater than the first length.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

Figure 1:
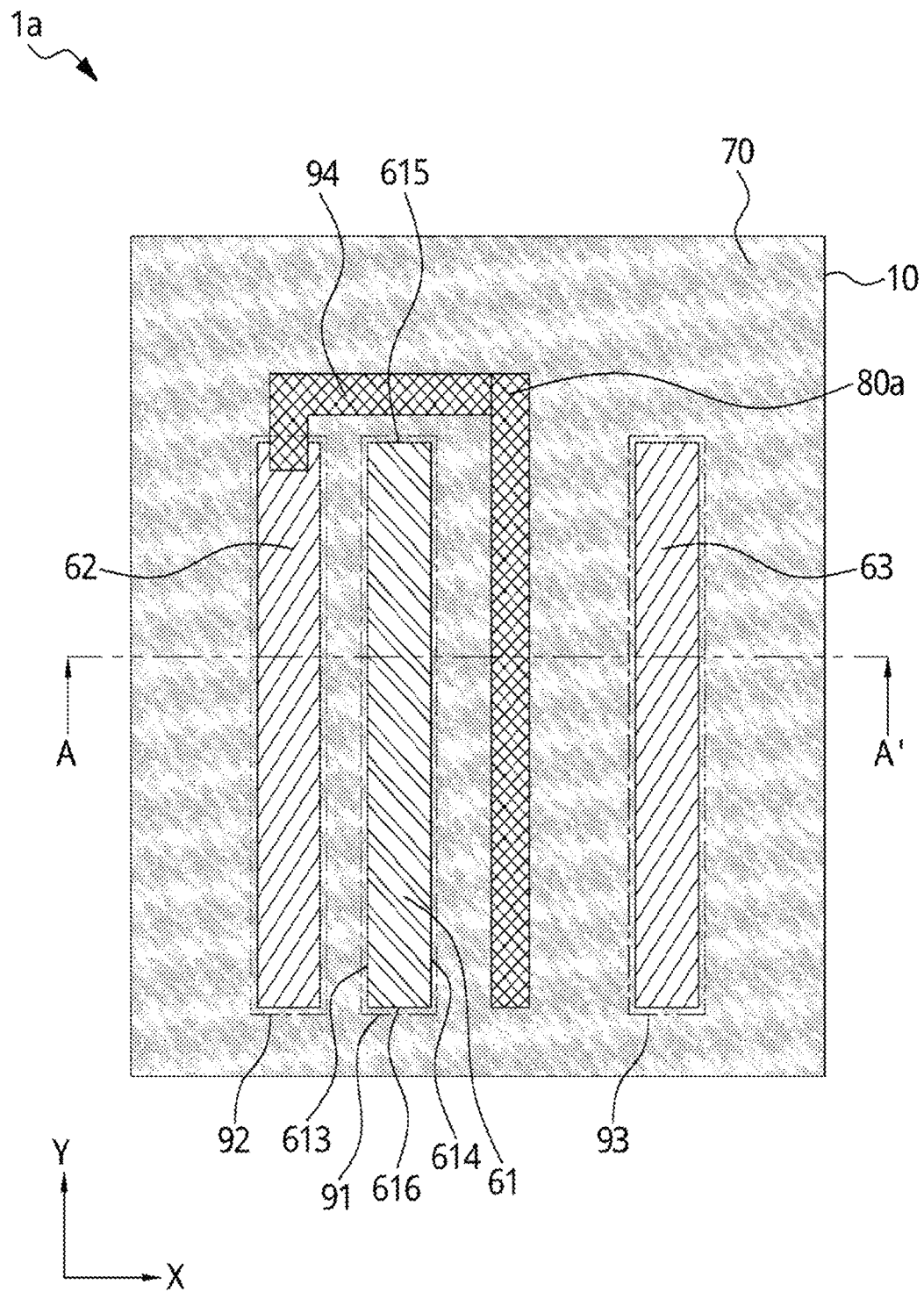
FIG. 1 is a top view of a semiconductor device structure in accordance with some embodiments of the present disclosure.

Common reference numerals are used throughout the drawings and the detailed description to indicate the same or similar components. The present disclosure will be more apparent from the following detailed description taken in conjunction with the accompanying drawings.

DETAILED DESCRIPTION

The following disclosure provides many different embodiments, or examples, for implementing different features of the provided subject matter. Specific examples of components and arrangements are described below. These are, of course, merely examples and are not intended to be limiting. In the present disclosure, reference to the formation or disposal of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail as follows. It should be appreciated, however, that the present disclosure provides many applicable concepts that can be embodied in a wide variety of specific contexts. The specific embodiments discussed are merely illustrative and do not limit the scope of the disclosure.

The present disclosure provides a semiconductor device structure including a conductive layer disposed between, for example, a gate structure and a drain. The length of the conductive layer may be well controlled; the distance between the gate structure and the conductive layer may be well controlled. As a result, the electric field, between the gate structure and drain, may be well controlled, thereby enhancing the performance of the semiconductor device structure. The semiconductor device structure of the present disclosure can be applied in, without limitation, HEMT devices, especially in low voltage HEMT devices, high voltage HEMT devices and/or radio frequency (RF) HEMT devices.

FIG. 1 is a top view of a semiconductor device structure 1a in accordance with some embodiments of the present disclosure. In order to clearly depict the layout of particular elements, some elements are omitted for brevity.

The semiconductor device structure 1a may include a substrate 10, a gate structure 61, an electrode 62 (or source electrode), an electrode 63 (or drain electrode), a dielectric structure 70, a conductive layer 80a, a contact structure 91, a contact structure 92, a contact structure 93 and a conductive trace 94. The gate structure 61 may be disposed between the electrode 62 and the electrode 63. The gate structure 61 may extend along the Y direction. The electrode 62 may extend along the Y direction. The electrode 63 may extend along the Y direction.

The conductive layer 80a may extend along the Y direction. The conductive layer 80a may be disposed between the gate structure 61 and the electrode 63.

The conductive trace 94 may extend from the conductive layer 80a. The conductive trace 94 may be configured to connect the conductive layer 80a and the electrode 62. The conductive layer 80a may be electrically connected to the electrode 62 through the conductive trace 94. The conductive layer 80a may be electrically isolated from the electrode 63.

The gate structure 61 may include a surface 613, a surface 614, a surface 615 and a surface 616. The surface 613 may be opposite to the surface 614. The surface 615 may be opposite to the surface 616. The surface 613 may face the electrode 62. The surface 613 may also be referred to as a side surface of the gate structure 61. The surface 614 may also be referred to as a side surface of the gate structure 61. The surface 615 may also be referred to as a side surface of the gate structure 61. The surface 616 may also be referred to as a side surface of the gate structure 61.

The surface 613 may face the electrode 62. The surface 613 may face away from the conductive layer 80a. The surface 614 may face the electrode 63. The surface 614 may face the conductive layer 80a. The surface 615 may face the conductive trace 94. The surface 616 may face away from the conductive trace 94. The corner defined by the surface 614 and the surface 615 may be surrounded by the conductive layer 80a and the conductive trace 94.

Figure 2A:
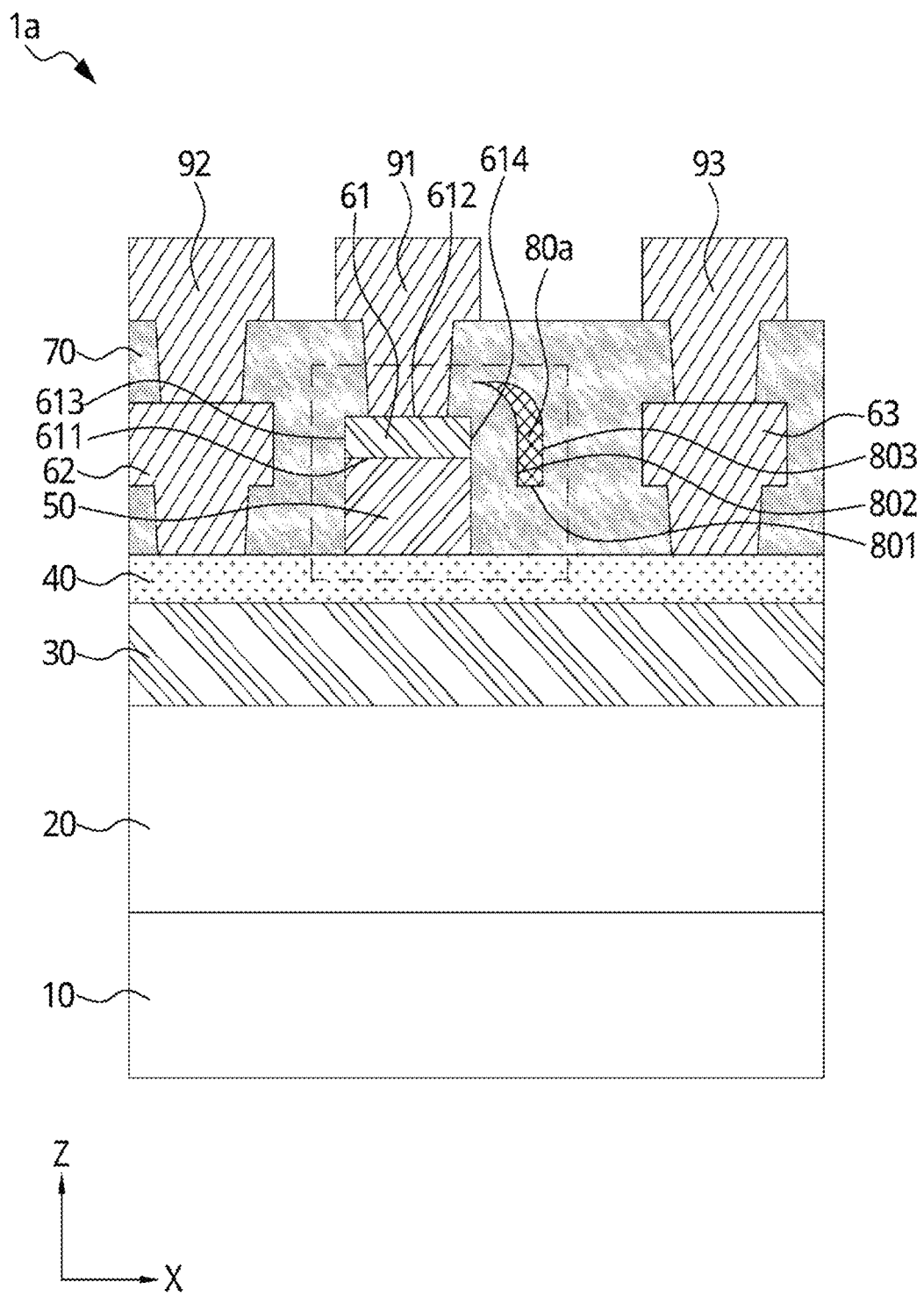
FIG. 2A is a cross-sectional view of a semiconductor device structure across line A-A' of FIG. 1 in accordance with some embodiments of the present disclosure.

FIG. 2A is a cross-sectional view of a semiconductor device structure 1a across line A-A' of FIG. 1 in accordance with some embodiments of the present disclosure. The semiconductor device structure 1a may include a substrate 10, a buffer layer 20, a nitride semiconductor layer 30, a nitride semiconductor layer 40, a doped group III-V layer 50, a gate structure 61, an electrode 62, an electrode 63, a dielectric structure 70, a conductive layer 80a, a contact structure 91, a contact structure 92 and a contact structure 93.

The substrate 10 may include, without limitation, silicon (Si), doped Si, silicon carbide (SiC), germanium silicide (SiGe), gallium arsenide (GaAs), or other semiconductor materials. The substrate 10 may include, without limitation, sapphire, silicon on insulator (SOI), or other suitable materials.

The buffer layer 20 may be disposed on the substrate 10. The buffer layer 20 may be configured to reduce defects due to the dislocation formed between the substrate 10 and the nitride semiconductor layer 30. The buffer layer 20 may include, but is not limited to, nitride, such as AlN, AlGaN or the like.

The nitride semiconductor layer 30 (or a channel layer) may be disposed on the buffer layer 20. The nitride semiconductor layer 30 may include a group III-V layer. The nitride semiconductor layer 30 may include, but is not limited to, a group III nitride, for example, a compound $In_aAl_bGa_{1-a-b}N$, in which a+b≤1. The group III nitride further includes, but is not limited to, for example, a compound $Al_aGa_{(1-a)}N$, in which a≤1. The nitride semiconductor layer 30 may include a gallium nitride (GaN) layer. GaN has a bandgap of about 3.4 eV. The thickness of the nitride semiconductor layer 30 may range, but is not limited to, from about 0.5 μm to about 10 μm.

The nitride semiconductor layer 40 (or a barrier layer) may be disposed on the nitride semiconductor layer 30. The nitride semiconductor layer 40 may include a group III-V layer. The nitride semiconductor layer 40 may include, but is not limited to, a group III nitride, for example, a compound $In_aAl_bGa_{1-a-b}N$, in which a+b≤1. The group III nitride may further include, but is not limited to, for example, a compound $Al_aGa_{(1-a)}N$, in which a≤1. The nitride semiconductor layer 40 may have a bandgap greater than that of the nitride semiconductor layer 30. The nitride semiconductor layer 40 may include an aluminum gallium nitride (AlGaN) layer. AlGaN has a bandgap of about 4.0 eV. The thickness of the nitride semiconductor layer 40 may range, but is not limited to, from about 10 nm to about 100 nm.

A heterojunction is formed between the nitride semiconductor layer 40 and the nitride semiconductor layer 30, and the polarization of the heterojunction forms a two-dimensional electron gas (2DEG) region in the nitride semiconductor layer 30.

The doped group III-V layer 50 (or a depletion layer) is disposed on the nitride semiconductor layer 40. The doped group III-V layer 50 is in direct contact with the nitride semiconductor layer 40. The doped group III-V layer 50 may include p-type dopants. It is contemplated that the doped group III-V layer 50 may include a p-doped GaN layer, p-doped AlGaN layer, p-doped AlN layer or other suitable III-V group layers. The p-type dopants may include at least one of magnesium (Mg), beryllium (Be), zinc (Zn) and cadmium (Cd).

The doped group III-V layer 50 may be configured to control the concentration of the 2DEG region in the nitride semiconductor layer 30. The doped group III-V layer 50 can be used to deplete the electrons of the 2DEG region directly under the doped group III-V layer 50.

The gate structure 61 may be disposed on the doped group III-V layer 50. The gate structure 61 may include a gate metal. The gate metal may include titanium (Ti), tantalum (Ta), tungsten (W), aluminum (Al), cobalt (Co), copper (Cu), nickel (Ni), platinum (Pt), lead (Pb), molybdenum (Mo) and compounds thereof (such as, but not limited to, titanium nitride (TiN), tantalum nitride (TaN), other conductive nitrides, or conductive oxides), metal alloys (such as aluminum-copper alloy (Al—Cu)), or other suitable materials.

The gate structure 61 may include a surface 611, a surface 612, a surface 613 and a surface 614. The surface 611 may be opposite to the surface 612. The surface 611 may be adjacent to the nitride semiconductor layer 40. The surface 613 may extend from the surface 611 to the surface 612. The surface 614 may extend from the surface 611 to the surface 612. The surface 611 may also be referred to as a lower surface of the gate structure 61. The surface 612 may also be referred to as an upper surface of the gate structure 61.

The electrode 62 may be disposed on the nitride semiconductor layer 40. The electrode 62 may be in contact with the nitride semiconductor layer 40. The electrode 62 may include, for example, without limitation, a conductive material. The conductive material may include metals, alloys, doped semiconductor materials (e.g., doped crystalline silicon), or other suitable conductive materials, such as Ti, Al, Ni, Cu, Au, Pt, Pd, W, TiN or other suitable materials. The electrode 62 may be electrically connected to ground. The electrode 62 may be electrically connected to virtual ground. The electrode 62 may be electrically connected to real ground.

The electrode 63 may be disposed on the nitride semiconductor layer 40. The electrode 63 may be in contact with the nitride semiconductor layer 40. The electrode 63 may include, for example, without limitation, a conductive material. The conductive materials may include metals, alloys, doped semiconductor materials (e.g., doped crystalline silicon), or other suitable conductive materials, such as Ti, Al, Ni, Cu, Au, Pt, Pd, W, TiN or other suitable materials.

The electrode 62 and the electrode 63 may be disposed between two opposite sides of the gate structure 61. Although the electrode 62 and the electrode 63 are disposed on two opposite sides of the gate structure 61 in FIG. 2A, the electrode 62, the electrode 63, and the gate structure 61 may have different configurations in other embodiments of the present disclosure due to the design requirements.

Although it is not illustrated in FIG. 2A, however, it is contemplated that structure of the electrode 62 can be varied or changed in some other embodiments of the subject application. Although it is not illustrated in FIG. 2A, however, it is contemplated that structure of the electrode 63 can be varied or changed in some other embodiments of the subject application. For example, a portion of the electrode 62 may be located or extended in the nitride semiconductor layer 30. A portion of the electrode 63 may be located or extended in the nitride semiconductor layer 30. The electrode 62 may be disposed on the nitride semiconductor layer 30. The electrode 63 may be disposed on the nitride semiconductor layer 30. The electrode 62 may penetrate the nitride semiconductor layer 40 to contact the nitride semiconductor layer 30. The electrode 63 may penetrate the nitride semiconductor layer 40 to contact the nitride semiconductor layer 30.

The dielectric structure 70 may be disposed on the nitride semiconductor layer 40. The dielectric structure 70 may be in contact with the nitride semiconductor layer 40. The dielectric structure 70 may be in contact with the doped group III-V layer 50. The dielectric structure 70 may be in contact with the gate structure 61. The dielectric structure 70 may define multiple openings exposing the nitride semiconductor layer 40. The dielectric structure 70 may define multiple openings exposing the gate structure 61. The electrode 62 may fill the opening defined by the dielectric structure 70. The electrode 63 may fill the opening defined by the dielectric structure 70.

The dielectric structure 70 may include dielectric materials. The dielectric materials may include oxide or nitride, such as SiN, $SiO_2$ and the like. The dielectric structure 70 may include, but is not limited to, a composite layer of an oxide and a nitride, such as $Al_2O_3$/SiN, $Al_2O_3$/$SiO_2$, AlN/SiN, AlN/$SiO_2$, and the like. The dielectric structure 70 may include multiple dielectric layers. There may be no boundary formed between multiple dielectric layers.

The conductive layer 80a may be disposed on the nitride semiconductor layer 40. The conductive layer 80a may be in contact with the dielectric structure 70. The conductive layer 80a may be separated from the gate structure 61 by the dielectric structure 70. The conductive layer 80a may include metals, alloys, doped semiconductor materials (e.g., doped crystalline silicon), or other suitable conductive materials, such as Ti, Al, Ni, Cu, Au, Pt, Pd, W, TiN or other suitable materials. The conductive layer 80a may be a single layer. The conductive layer 80a may include multiple layers, which may include a combination of Ti/Al or Ti/W. The conductive layer 80a may include an alloy, such as AlCu or TiAl. The conductive layer 80a may serve as, but is not limited to, a field plate to control the electric field between the gate structure 61 and the electrode 63.

The conductive layer 80a may include a surface 801, a surface 802 and a surface 803. The surface 801 may also be referred to as a lower surface of the conductive layer 80a. The surface 802 may also be referred to as a side surface of the conductive layer 80a. The surface 803 may also be referred to as a side surface of the conductive layer 80a.

The surface 801 may face the nitride semiconductor layer 40.

The surface 802 may extend from the surface 801. The surface 802 may face the gate structure 61. The surface 802 may be adjacent to the electrode 62. The surface 802 may face the surface 614 of the gate structure 61.

The surface 803 may extend from the surface 801. The surface 803 may face the electrode 63. The surface 803 may be adjacent to the electrode 63. The surface 802 and the surface 803 may meet. The surface 802 may intersect with the surface 803. The surface 802 may intersect with the surface 803 away from the surface 801.

The surface 613 of the gate structure 61 may face away from the conductive layer 80a. That is, there is no conductive layer 80a between the gate structure 61 and the electrode 62. The surface 612 of the gate structure 61 may be exposed from the conductive layer 80a. The conductive layer 80a may not cover the gate structure 61. The conductive layer 80a may not cover the surface 612 of the gate structure 61. The surface 612 of the gate structure 61 may be completely exposed from the conductive layer 80a. The conductive layer 80a does not overlap the gate structure 61.

The contact structure 91 may be disposed on the gate structure 61. The contact structure 91 may include conductive materials, such as metals, alloys, doped semiconductor materials, or other suitable conductive materials. The contact structure 91 may fill the opening defined by the dielectric structure 70.

The contact structure 92 may be disposed on the electrode 62. The contact structure 92 may include conductive materials, such as metals, alloys, doped semiconductor materials, or other suitable conductive materials. The contact structure 92 may fill the opening defined by the dielectric structure 70. The material of the contact structure 92 may not be the same as that of the electrode 62.

The contact structure 93 may be disposed on the electrode 63. The contact structure 93 may include conductive materials, such as metals, alloys, doped semiconductor materials, or other suitable conductive materials. The contact structure 93 may fill the opening defined by the dielectric structure 70. The material of the contact structure 93 may not be the same as that of the electrode 63.

Although it is not illustrated in FIG. 2A, the conductive trace 94 may be shown in other cross-sections. The material of the conductive trace 94 may be the same as or similar to that of the conductive layer 80a.

Figure 2B:
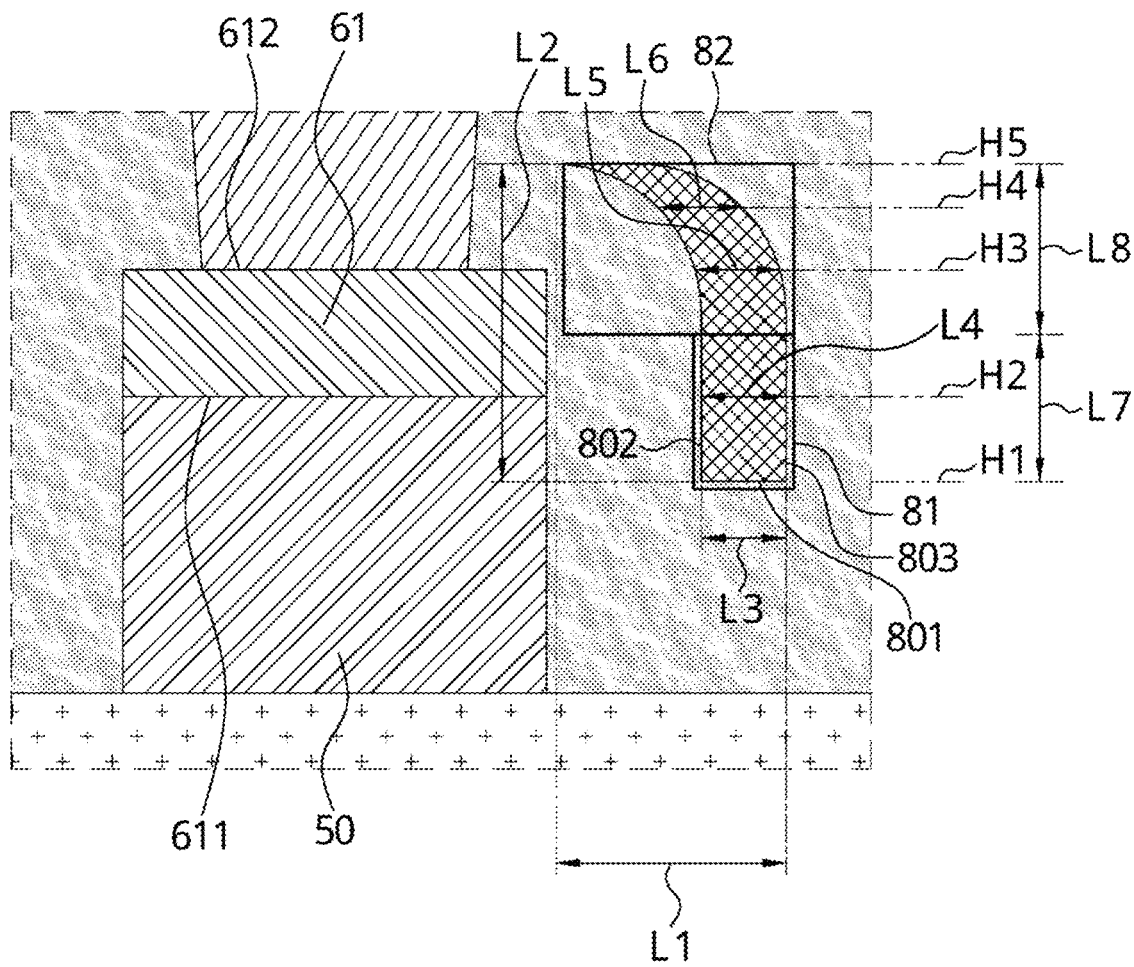
FIG. 2B is an enlarged view of the structure in the dotted box as shown in FIG. 2A in accordance with some embodiments of the present disclosure.

FIG. 2B is an enlarged view of the structure in the dotted box as shown in FIG. 2A in accordance with some embodiments of the present disclosure.

The conductive layer 80a may have a length L1 along the X direction. The length L1 may be defined as a lateral length from a cross section view perspective. The conductive layer 80a may have a length L2 along the Z direction. The length L2 may be defined as a longitudinal length from a cross section view perspective. The X direction may be parallel to a surface, such as an upper surface, of the substrate 10. The Z direction may be substantially perpendicular to the X direction. The length L2 may be greater than length L1.

The conductive layer 80a may have different lengths along the X direction at different elevations. The conductive layer 80a may have a length L3 at an elevation H1. The elevation H1 may have a height the same as that of the surface 801. The conductive layer 80a may have a length L4 at an elevation H2. The elevation H2 may have a height the same as that of the surface 611 of the gate structure 61. The conductive layer 80a may have a length L5 at an elevation H3. The elevation H3 may have a height the same as that of the surface 612 of the gate structure 61. The conductive layer 80a may have a length L6 at an elevation H4. The elevation H4 may have a height exceeding that of the surface 612 of the gate structure 61.

The length L3 may be substantially the same as the length L4. The length L4 may be greater than the length L5. The length L5 may be greater than the length L6.

The conductive layer 80a may include a tapered structure. The conductive layer 80a may tapered toward the gate structure 61. The conductive layer 80a may include a portion 81 and a portion 82. The portion 82 may be over the portion 81. The surface 802 and the surface 803 of the portion 81 may be substantially parallel to each other. The surface 802 of the portion 82 may not be parallel to the surface 803 of the portion 82. The portion 82 may be relatively narrower than the portion 81. For example, the portion 82 may have a length, such as length L5, less than the length, such as length L3, of the portion 81. The portion 82 may be tapered along the Z direction from the nitride semiconductor layer 30 toward the nitride semiconductor layer 40. The portion 82 may be tapered along the X direction from the electrode 63 toward the electrode 62.

The portion 81 may have a length L7 along the Z direction. The portion 82 may have a length L8 along the Z direction. The length L8 may be greater than the length L7.

The surface 802 may intersect with the surface 803 at an elevation H5. The elevation H5 may have a height exceeding the surface 612 of the gate structure 61.

Figure 3:
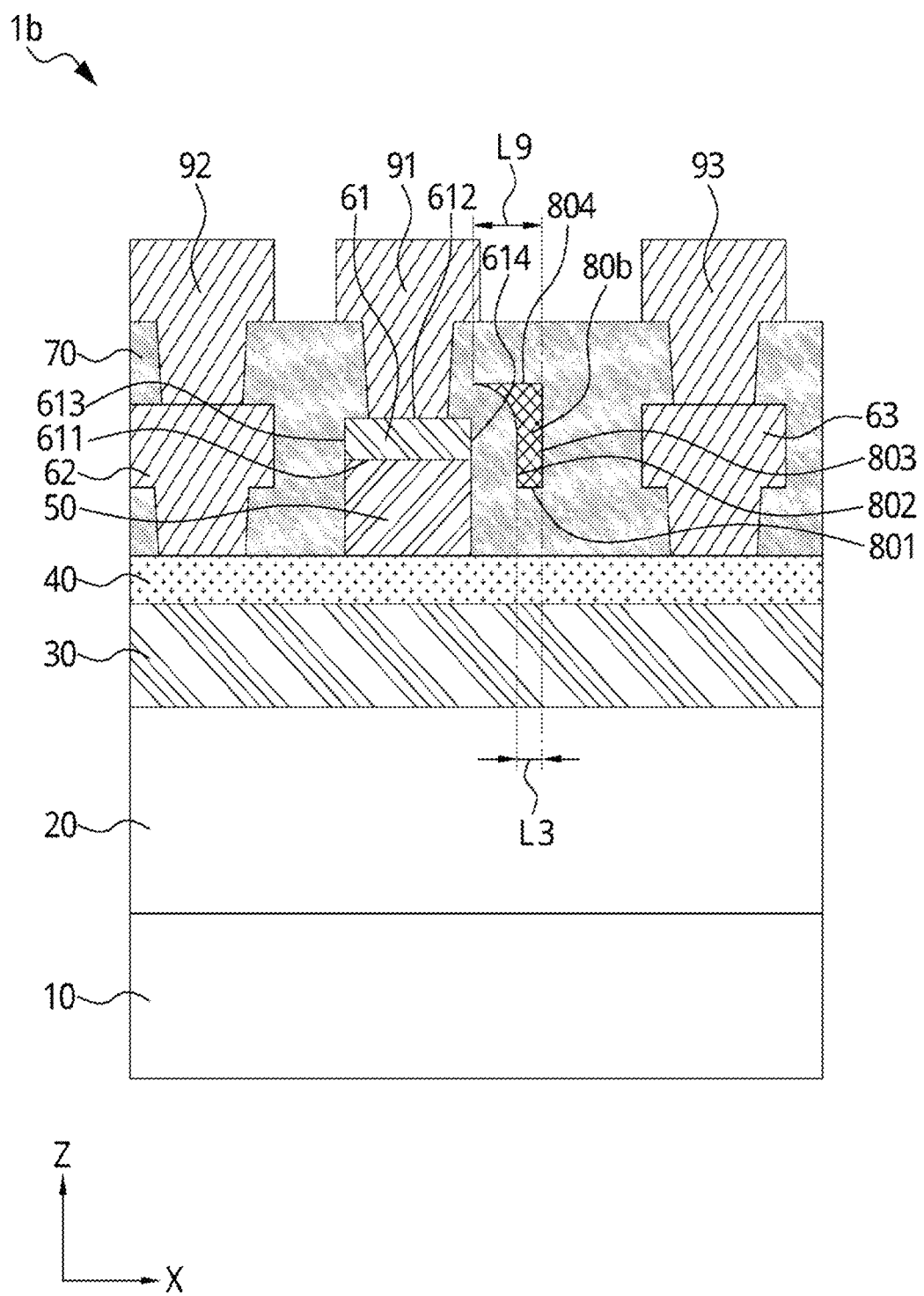
FIG. 3 is a cross-sectional view of a semiconductor device structure in accordance with some embodiments of the present disclosure.

FIG. 3 is a cross-sectional view of a semiconductor device structure 1b in accordance with some embodiments of the present disclosure. The semiconductor device structure 1b may have a structure similar to the semiconductor device structure 1a except that the semiconductor device structure 1b may include a conductive layer 80b.

The conductive layer 80b may have a surface 804. The surface 804 may extend from the surface 802 to the surface 803. The surface 804 may have a length L9 along the X direction. The length L9 may be greater than that of the length L3.

Figure 4A:
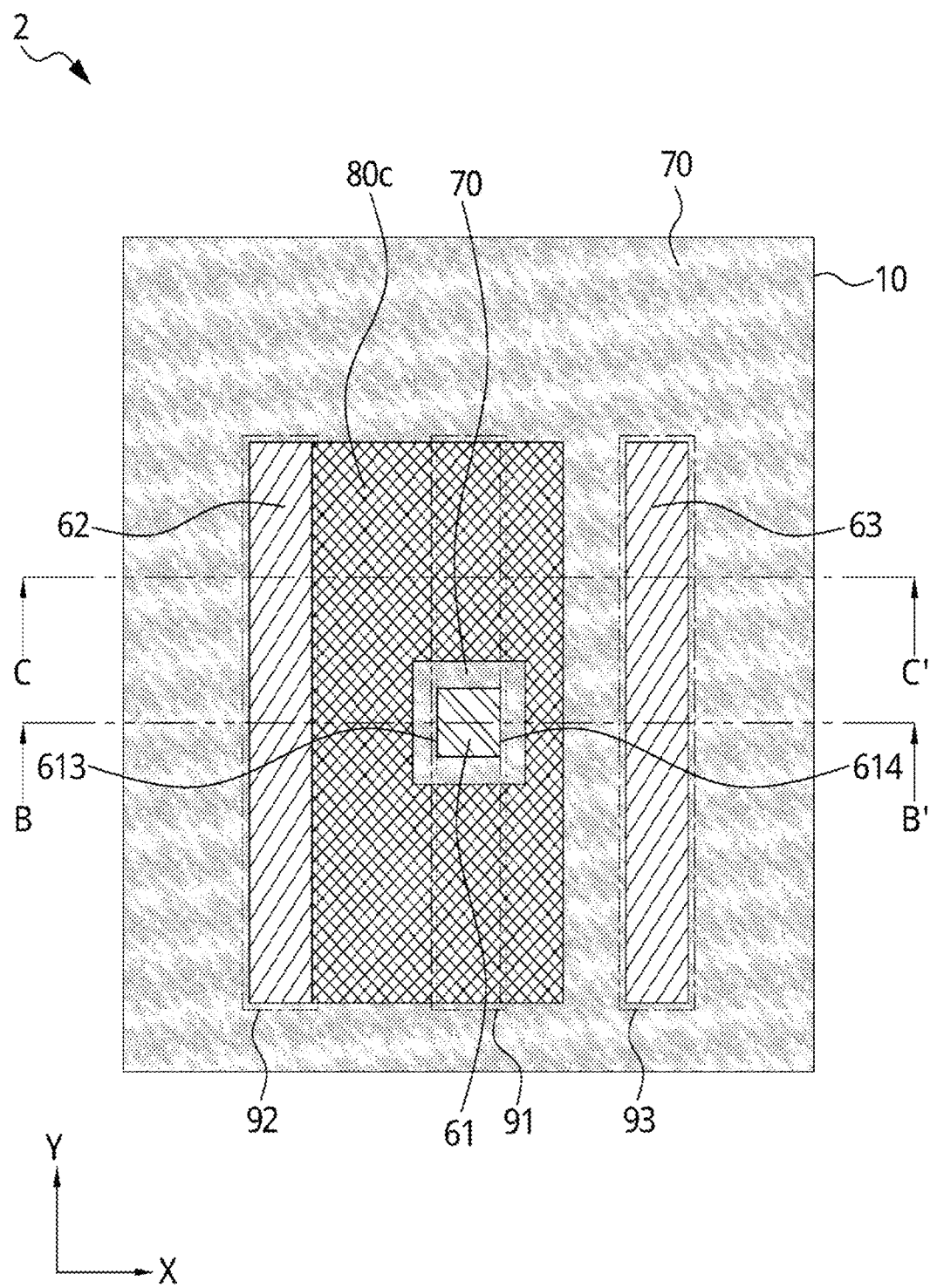
FIG. 4A is a top view of a semiconductor device structure of some other embodiments of the present disclosure.

FIG. 4A is a top view of a semiconductor device structure 2 of some embodiments of the present disclosure. In order to clearly depict the layout of particular elements, some elements are omitted for brevity.

The semiconductor device structure 2 may include a gate structure 61, an electrode 62, an electrode 63, a conductive layer 80c, a contact structure 91, a contact structure 92 and a contact structure 93. The conductive layer 80c may extend from the electrode 62 toward the electrode 63. The conductive layer 80c may cover the gate structure 61. A portion of the gate structure 61 is exposed from the conductive layer 80c.

Figure 4B:
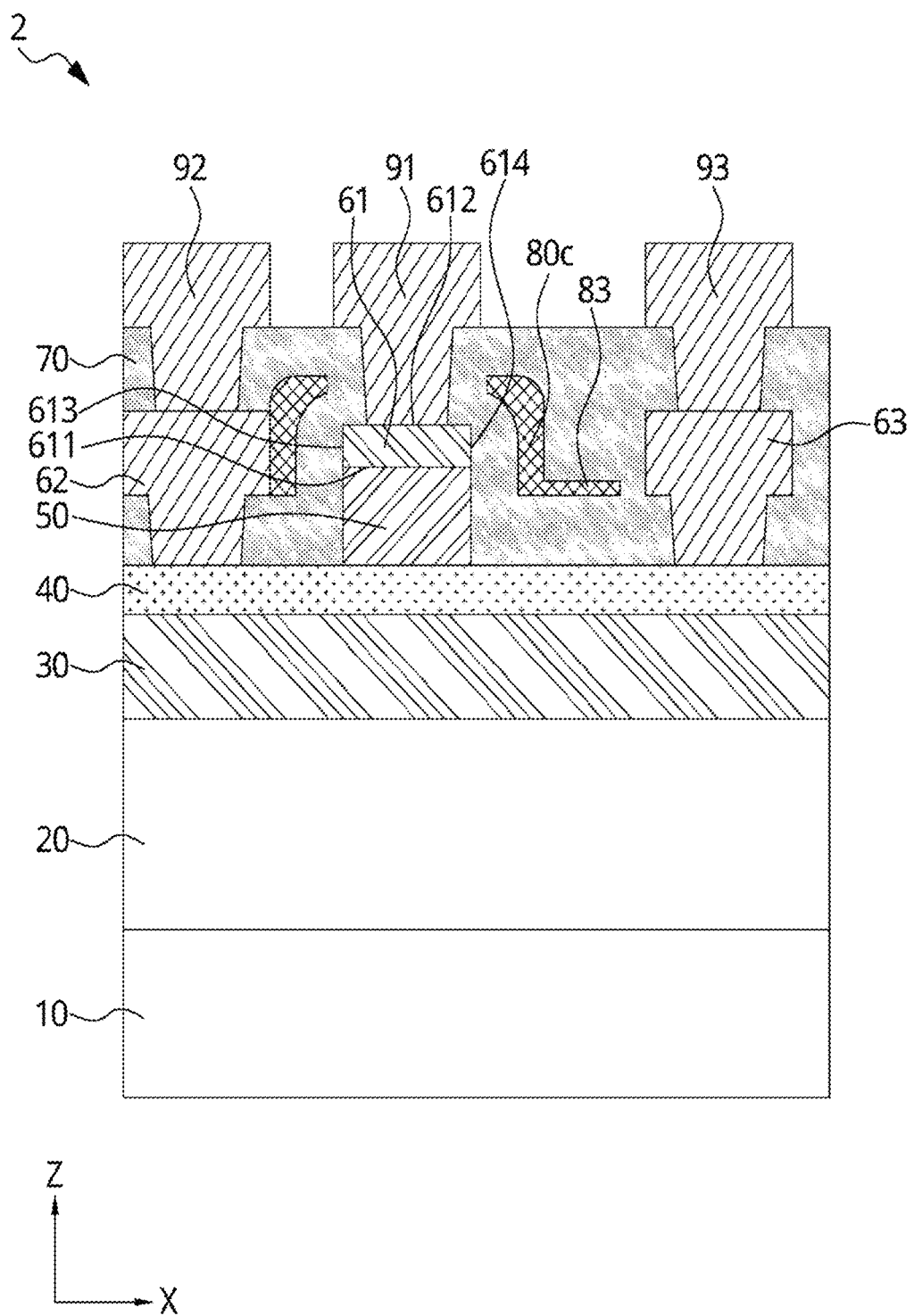
FIG. 4B is a cross-sectional view of a semiconductor device structure across line B-B' of FIG. 4A.

FIG. 4B is a cross-sectional view of a semiconductor device structure 2 across line B-B' of FIG. 4A.

The surface 613 of the gate structure 61 may face the conductive layer 80c. The surface 614 of the gate structure 61 may face the conductive layer 80c. The conductive layer 80c may have a protruding portion 83. The protruding portion 83 may extend from the conductive layer 80c toward the electrode 63. The upper surface of the protruding portion 80a may have an elevation less than that of the surface 611 of the gate structure 61.

Figure 4C:
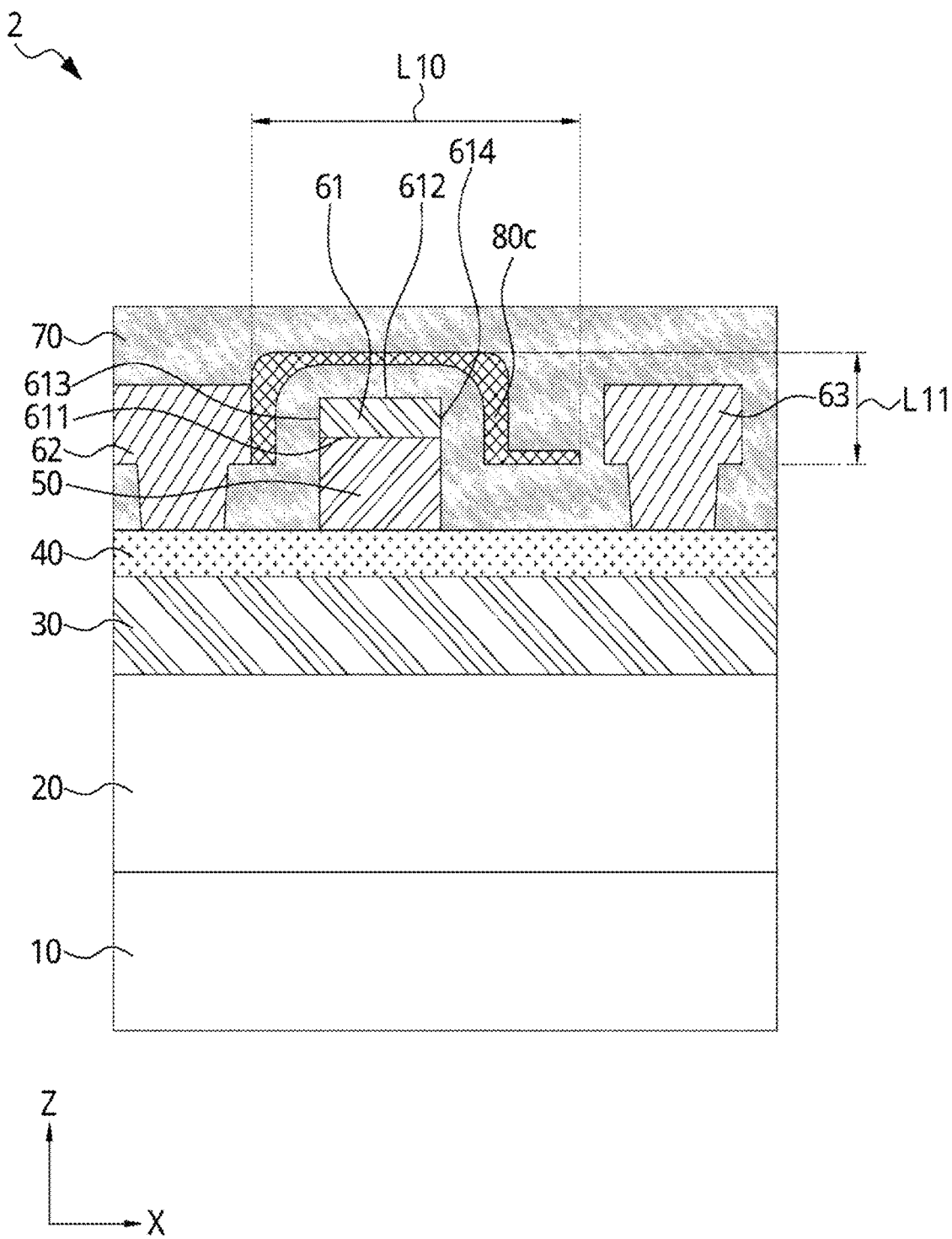
FIG. 4C is a cross-sectional view of a semiconductor device structure across line C-C' of FIG. 4A.

FIG. 4C is a cross-sectional view of a semiconductor device structure 2 across line C-C' of FIG. 4A in accordance with some embodiments of the present disclosure.

The surface 612 may be completely covered by the conductive layer 80c. The conductive layer 80c may have a length L10 along the X direction. The conductive layer 80c may have a length L11 along the Z direction. The length L10 may be greater than the length L11.

As the semiconductor device structure becomes much smaller, the location and the pattern of the conductive layer 80a is crucial to control the electric field between the gate structure 61 and the electrode 63. Since the conductive layer 80a of the semiconductor device structure 1a does not have a protruding portion, such as the protruding portion 83, the conductive layer 80a may have a relatively smaller size, which causes a relatively great distance between the conductive layer 80a and the electrode 63, and thus prevents shorting. As a result, the distance between the gate structure 61 and the electrode 63 may be further reduced, thereby producing a relatively smaller semiconductor device structure.

FIG. 5A, FIG. 5B, FIG. 5C, FIG. 5D, FIG. 5E, FIG. 5F, FIG. 5G, and FIG. 5H illustrate various stages of a method for manufacturing a semiconductor device structure in accordance with some embodiments of the present disclosure.

Figure 5A:
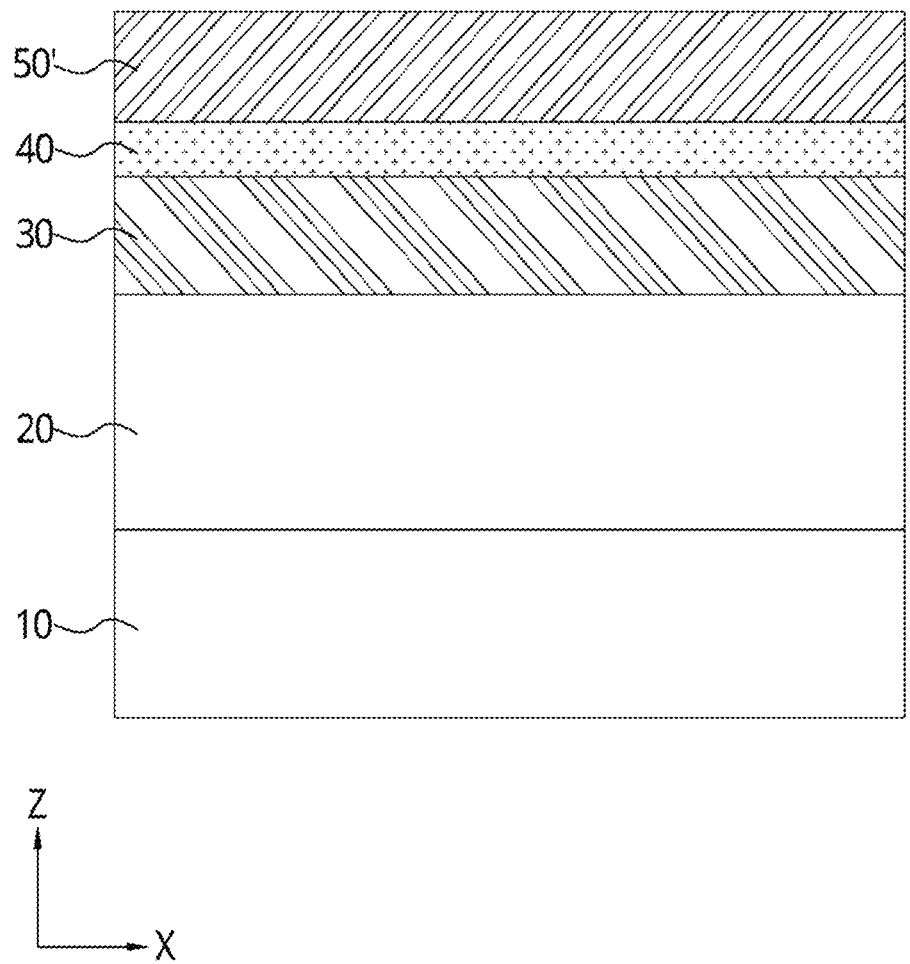
FIG. 5A, FIG. 5B, FIG. 5C, FIG. 5D, FIG. 5E, FIG. 5F, FIG. 5G, and FIG. 5H illustrate various stages of a method for manufacturing a semiconductor device structure in accordance with some embodiments of the present disclosure.

Referring to FIG. 5A, the substrate 10 is provided. The buffer layer 20, the nitride semiconductor layer 30, the nitride semiconductor layer 40 and the doped group III-V material 50' may be formed on the substrate 10. The buffer layer 20, the nitride semiconductor layer 30 and the nitride semiconductor layer 40, for example, may be formed through metal organic chemical vapor deposition (MOCVD), epitaxial growth or other suitable deposition steps. The doped group III-V material 50' may be formed through the epitaxy process.

Figure 5B:
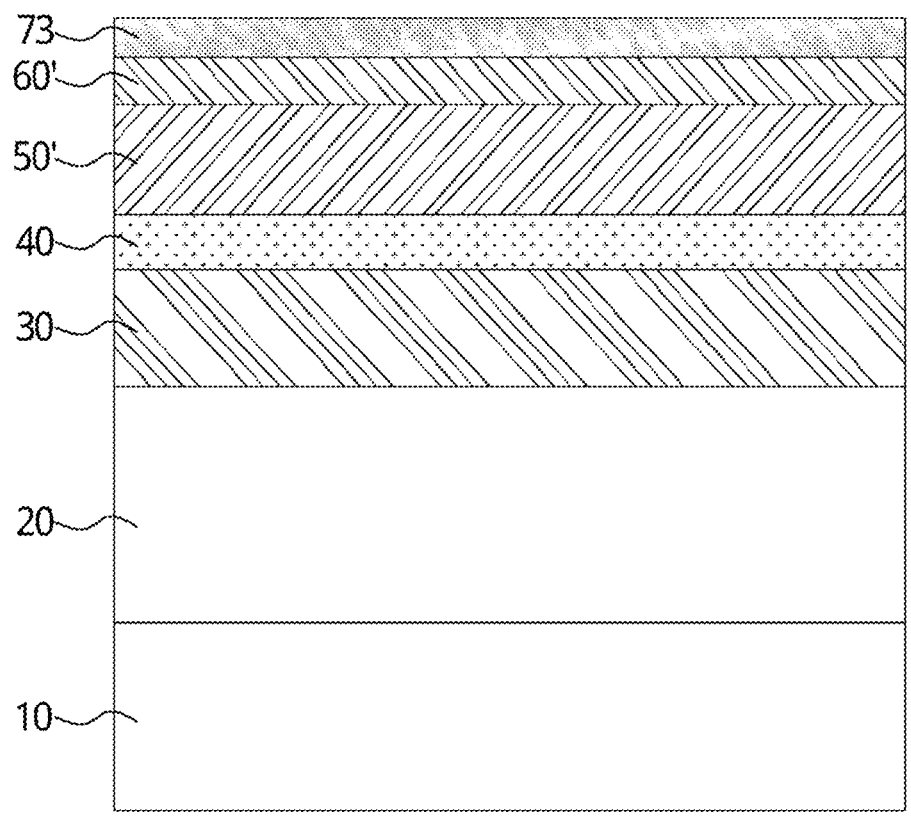

Referring to FIG. 5B, a conductive material 60' and a mask layer 73 may be formed on the doped group III-V material 50'. The conductive material 60' may be formed by depositing one or more layers of materials through physical vapor deposition (PVD), chemical vapor deposition (CVD), sputtering or other suitable processes. The mask layer 73 may be configured to define the pattern of the subsequently formed gate structure 61 and the doped group III-V layer 50. The mask layer 73 may include oxide, nitride, oxynitride or other suitable materials. The mask layer 73 may be formed by PVD, CVD or other suitable processes.

Figure 5C:
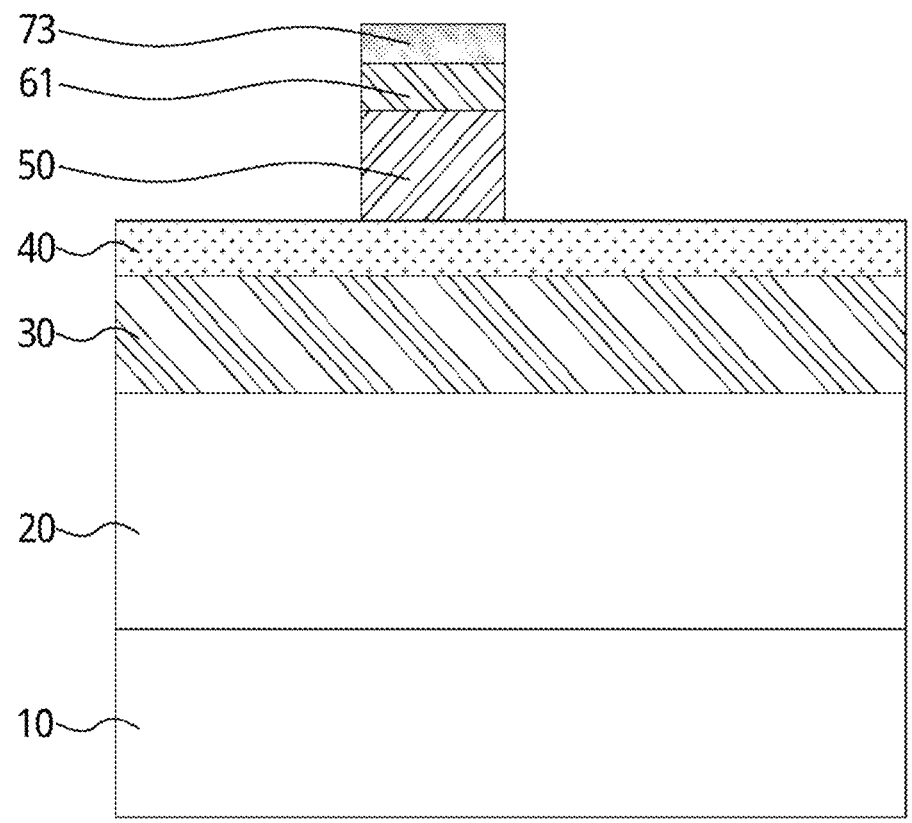

Referring to FIG. 5C, a portion of the doped group III-V material 50', conductive material 60' and mask layer 73 are patterned to form the doped group III-V layer 50 and the gate structure 61. One or more etching processes may be performed to pattern the doped group III-V material 50', conductive material 60' and mask layer 73. The etching process may include wet etching, dry etching or other suitable etching processes.

Figure 5D:
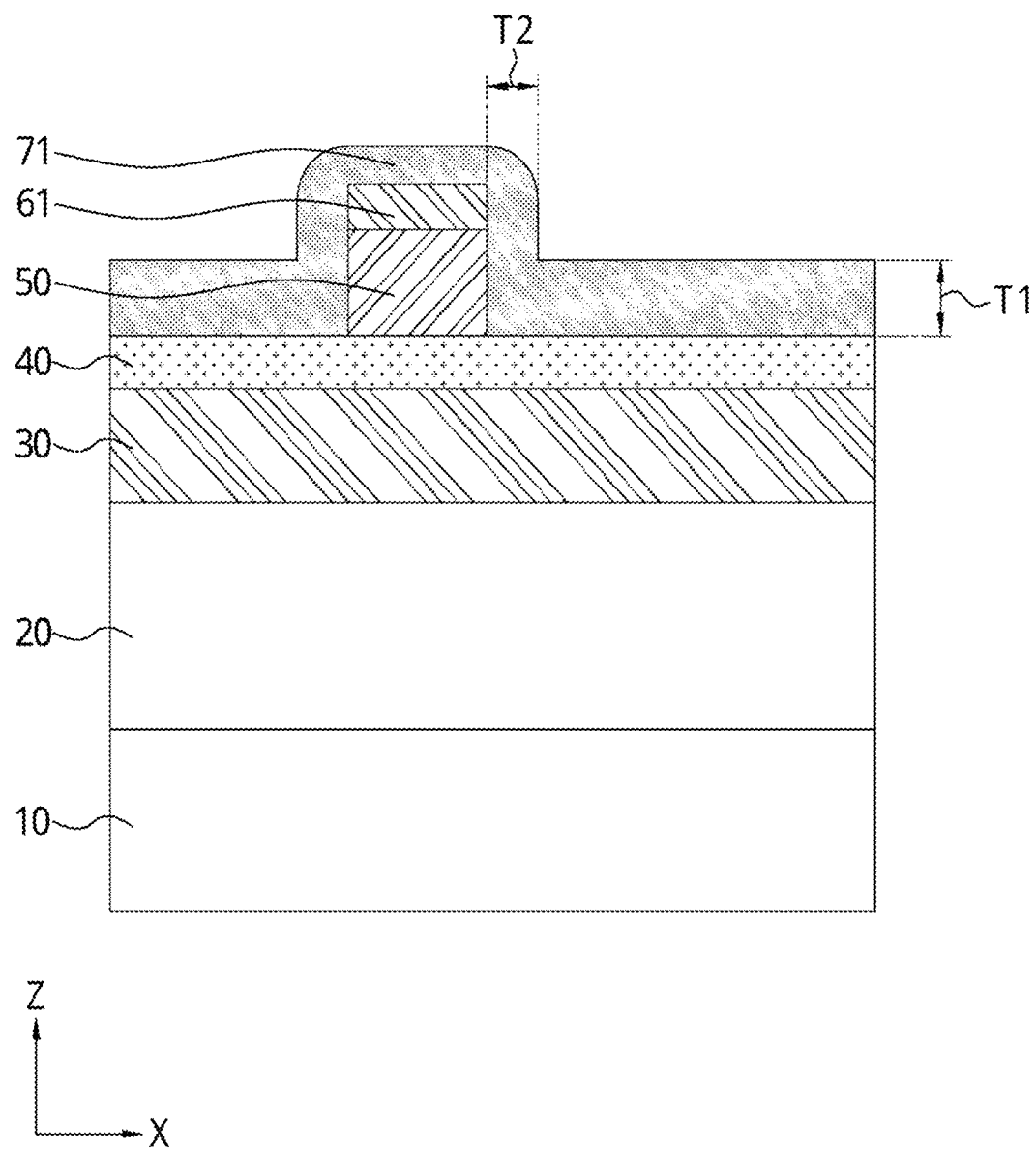

Referring to FIG. 5D, the mask layer 73 may be removed. The dielectric layer 71 may be formed to cover the nitride semiconductor layer 40, the doped group III-V layer 50 and the gate structure 61. The dielectric layer 71 may be formed by CVD, PVD, atomic layer deposition (ALD), or other suitable processes.

The dielectric layer 71 may have a thickness T1, over the nitride semiconductor layer 40, along the Z direction. The dielectric layer 71 may have a thickness T2, along the X direction, on the gate structure 61. The thickness T1 may not be the same as the thickness T2. Although the thickness T1 may not be the same as the thickness T2, the thickness T2 is proportional to the thickness T1. The thickness T1 may be substantially the same as the thickness T2.

Figure 5E:
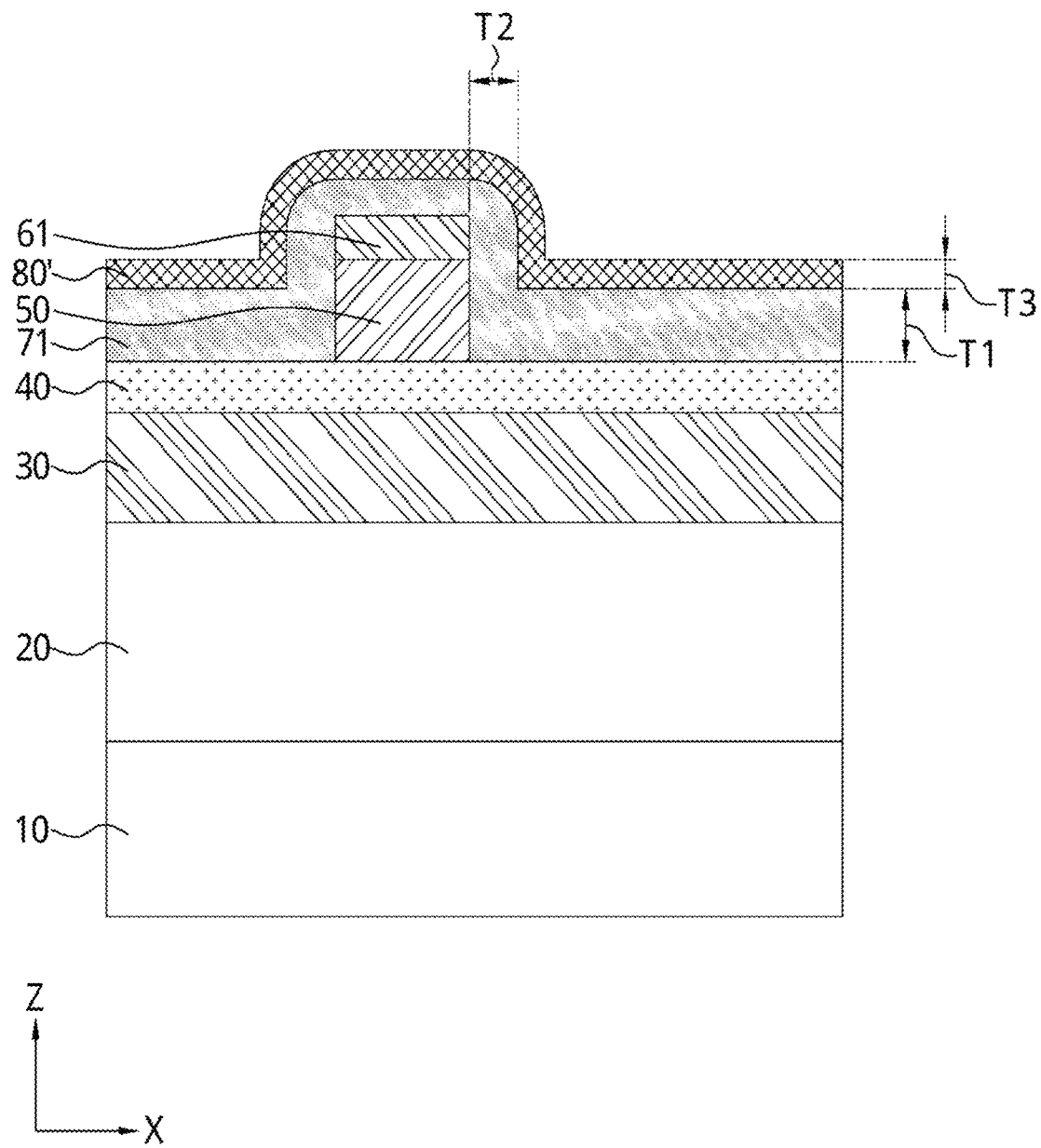

Referring to FIG. 5E, a conductive material 80' is formed on the dielectric layer 71. The conductive material 80' may be formed by CVD, MOCVD, plasma enhanced chemical vapor deposition (PECVD), ALD, PEALD or other suitable processes. The conductive material 80' may have a thickness T3 along the Z direction.

Figure 5F:
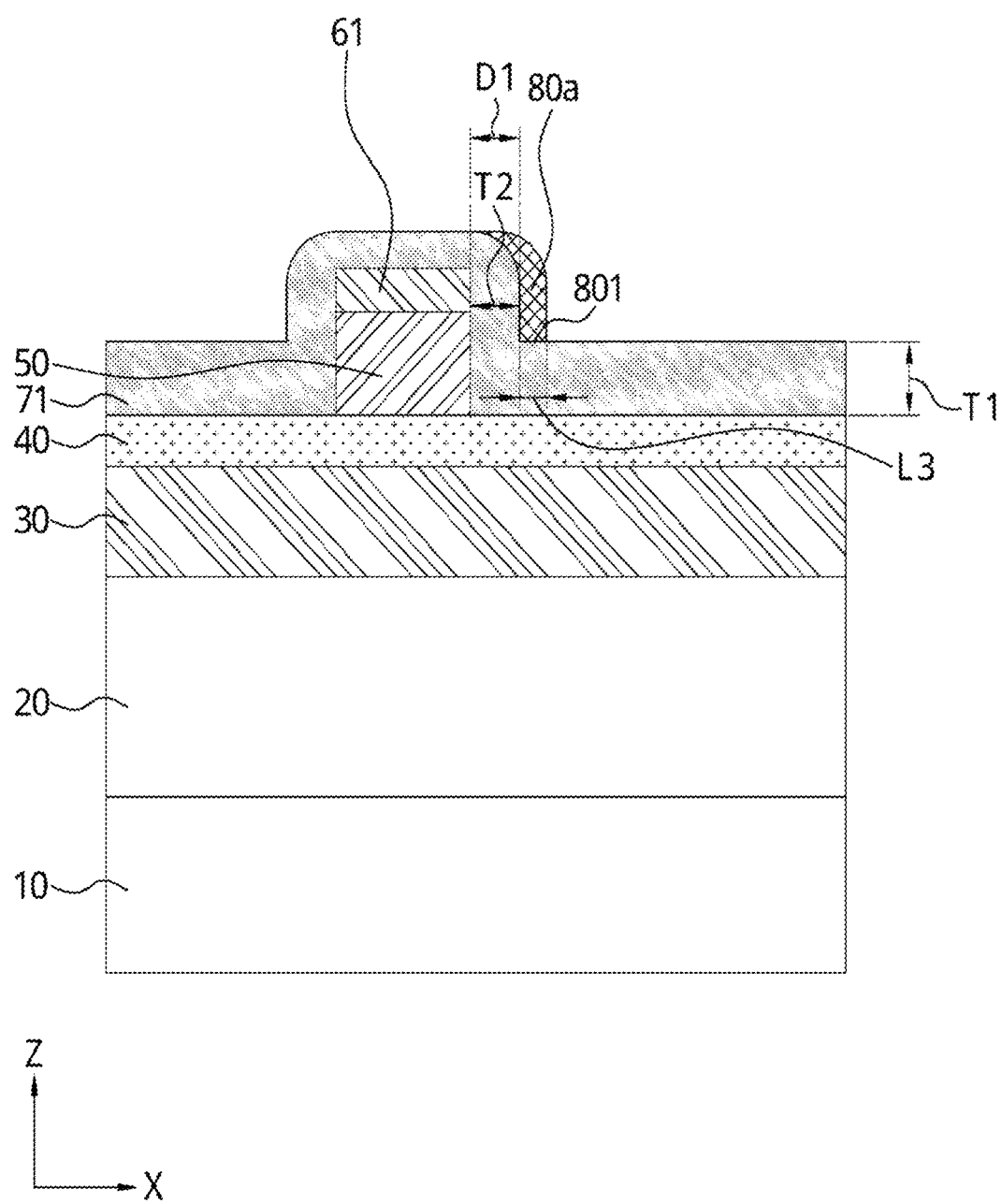

Referring to FIG. 5F, a portion of the conductive material 80' may be removed to form the conductive layer 80a. The conductive material 80' may remain on one sidewall of the dielectric layer 71. The conductive material 80' on another sidewall of the dielectric layer 71 may be removed. The conductive material 80' over the gate structure 61 may be removed. The conductive material 80' directly over the gate structure 61 may be removed. The conductive material 80' may be removed by an anisotropic etching process. The conductive layer 80a may be formed by performing an anisotropic etching process on the conductive material 80'. By using an anisotropic process, a lithography process may be omitted. That is, the conductive layer 80a may be formed without using a reticle and a lithography process. As a result, the process may be simplified and the cost is reduced.

There is a distance D1, along the X direction, between the conductive layer 80a and the gate structure 61. The distance D1 may be substantially the same as the thickness T2 of the dielectric layer 71. The distance D1 between the conductive layer 80a may be determined by controlling the thickness T1 of the dielectric layer 71 during deposition of the dielectric layer 71. In addition, the length L3 of the conductive layer 80a may be determined by controlling the thickness T3 of the conductive material 80'. The distance D1 between the conductive layer 80a and the gate structure 61 as well as the length L3 of the conductive layer 80a, which are variables crucial to controlling the electric field between the gate and drain, may be determined by controlling the thickness T1 and thickness T3, respectively. As the size of the semiconductor device structure is reduced, the distance between the gate and the drain becomes much less. In a conventional semiconductor device structure, in order to form an effective field plate in a smaller-sized semiconductor device structure, a delicate reticle is needed to precisely define the pattern of the field plate. However, such a delicate reticle will incur a great cost. In the present disclosure, the pattern of the conductive layer 80a may be relatively precisely defined by controlling the thickness of the dielectric layer 71 and the thickness of the conductive material 80', which are easily controlled. In addition, the reticle may be omitted. Therefore, the cost for manufacturing the semiconductor device structure 1a may be decreased.

Figure 5G:
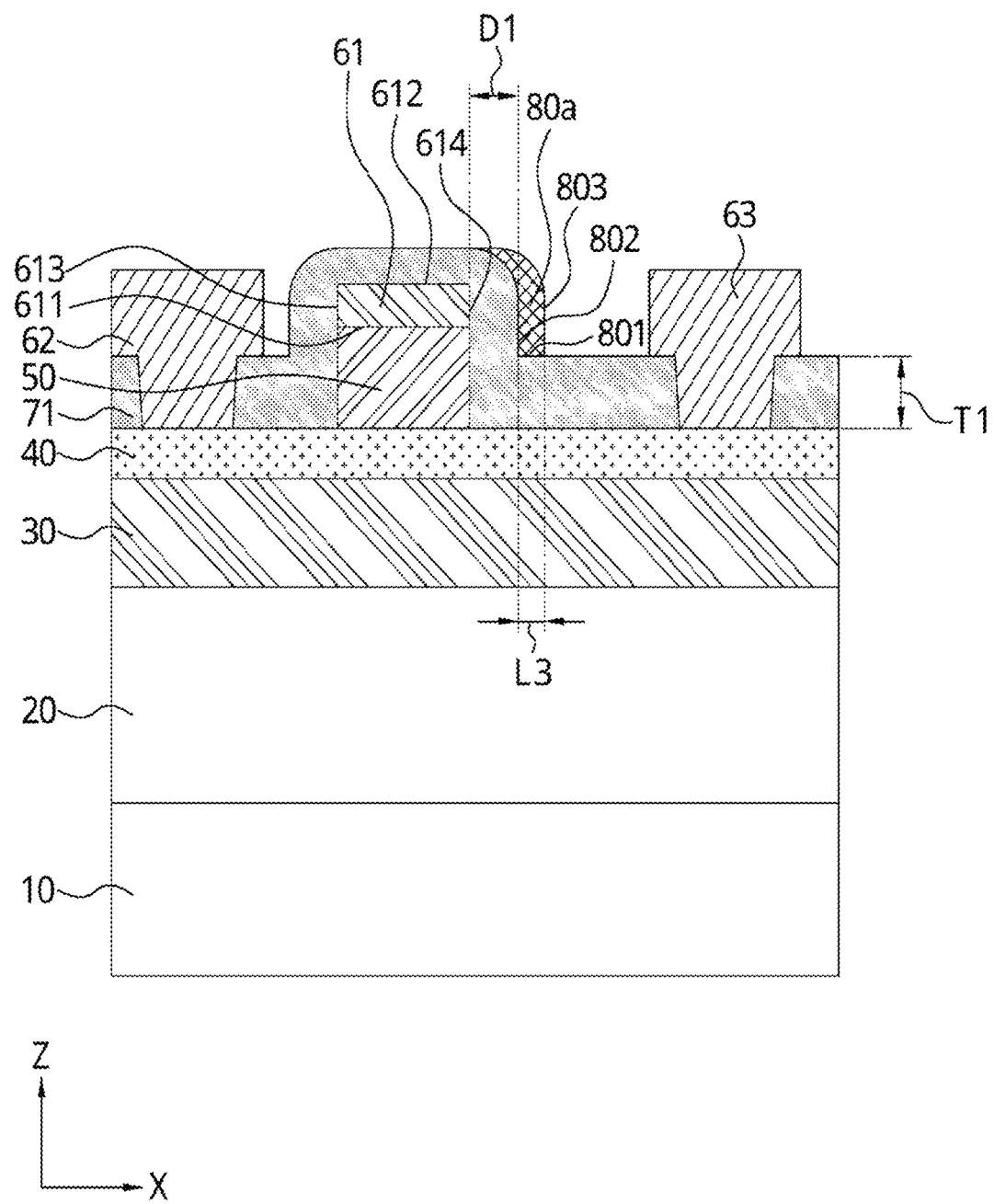

Referring to FIG. 5G, the dielectric layer 71 may be patterned to form openings. An electrode 62 and electrode 63 may be formed to fill the openings. A conductive material may be deposited to cover the dielectric layer 71, and an etching process may be performed to remove a portion of the conductive material, thereby forming the electrode 62 and the electrode 63.

Figure 5H:
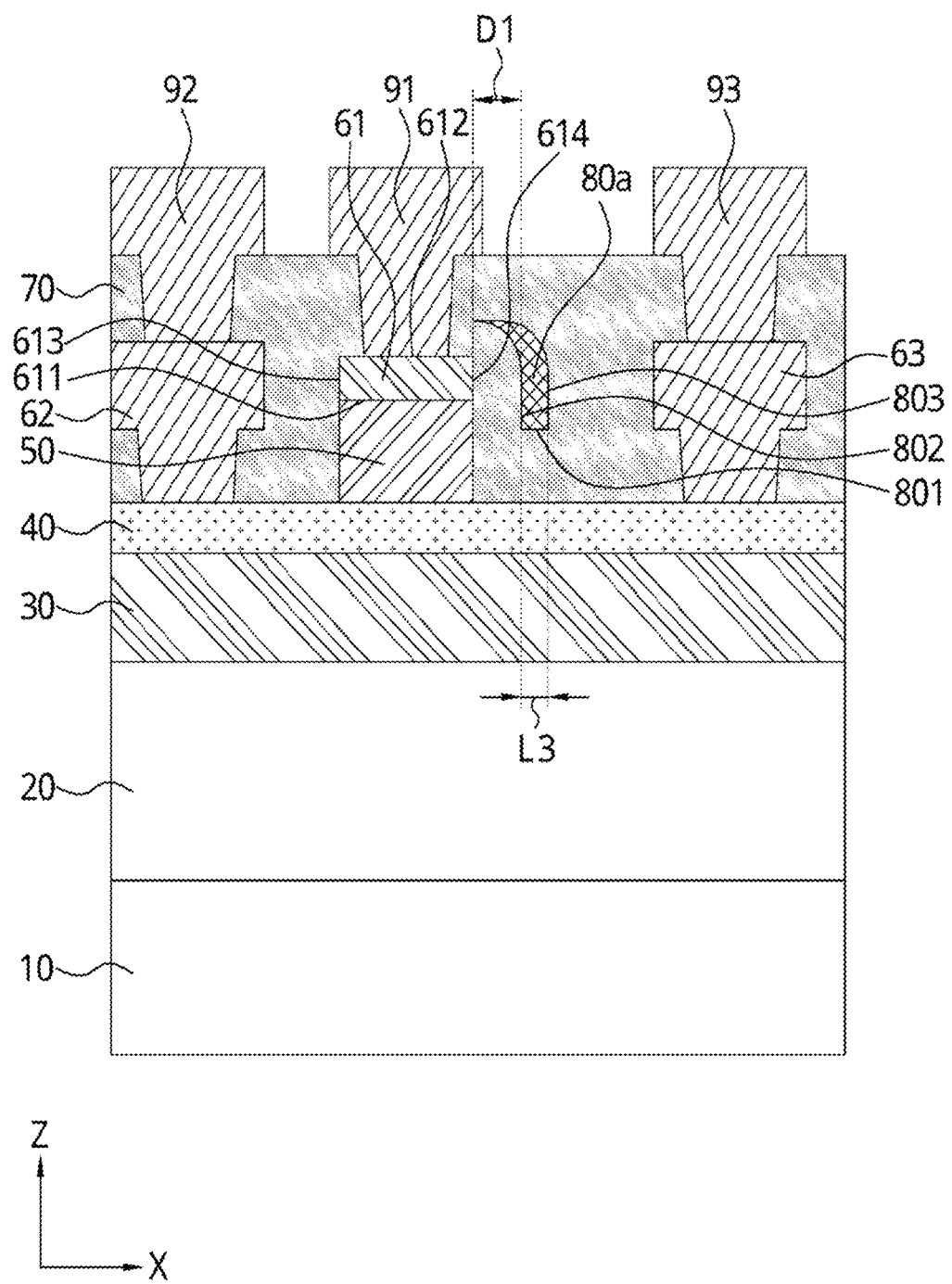

Referring to FIG. 5H, another dielectric layer(s) may be formed on the dielectric layer 71 to form a dielectric structure 70. In addition, the contact structure 91, contact structure 92 and contact structure 93 can be formed to form a semiconductor device structure same or similar to the semiconductor device structure 1a as described and illustrated in FIG. 2.

As used herein, spatially relative terms, such as "beneath," "below," "lower," "above," "upper," "lower," "left," "right" and the like, may be used for ease in describing one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 80 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately," "substantially," "substantial" and "about" are used to describe and account for small variations. When used in conjunction with an event or circumstance, the terms can refer to instances in which the event of circumstance occurs precisely as well as instances in which the event or circumstance occurs to a close approximation. As used herein with respect to a given value or range, the term "about" generally refers to within ±10%, ±5%, ±1%, or ±0.5% of the given value or range. Ranges can be expressed herein as being from one endpoint to another endpoint or between two endpoints. All ranges disclosed herein are inclusive of the endpoints, unless specified otherwise. The term "substantially coplanar" can refer to two surfaces within micrometers (μ) of lying along a same plane, such as within 10μ, within 5 μm, within 1μ, or within 0.5 μm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A semiconductor device structure, comprising:
a substrate having a first surface;
a first nitride semiconductor layer disposed on the substrate;
a second nitride semiconductor layer disposed on the first nitride semiconductor layer;
a gate structure disposed on the second nitride semiconductor layer;
a dielectric layer covering the gate structure and the second nitride semiconductor layer; and
a conductive layer disposed on the dielectric layer;
wherein the conductive layer has a first length extending in a first direction substantially parallel to the first surface of the substrate at a lower surface of the conductive layer and a second length extending in the first direction different from the first length;
wherein the conductive layer comprises a first surface extending from the lower surface and a second surface extending from the lower surface, and the first surface intersects the second surface away from the lower surface.

2. The semiconductor device structure of claim 1, wherein the first surface intersects the second surface at a first elevation, the dielectric layer has an upper surface at a second elevation, and the first elevation is substantially the same as the second elevation.

3. The semiconductor device structure of claim 1, wherein an upper surface of the gate structure is exposed from the conductive layer.

4. The semiconductor device structure of claim 1, wherein the conductive layer has a first portion and a second portion over the first portion, and the second portion is narrower than the first portion.

5. The semiconductor device structure of claim 1, wherein the conductive layer has a first portion and a second portion over the first portion, and the first portion is narrower than the second portion.

6. The semiconductor device structure of claim 1, further comprising:
a first electrode and a second electrode, wherein the second electrode is electrically isolated from the conductive layer.

7. The semiconductor device structure of claim 6, wherein the conductive layer is disposed between the gate structure and the second electrode.

* * * * *